US005471019A

United States Patent [19]

Maire

[11] Patent Number: 5,471,019
[45] Date of Patent: Nov. 28, 1995

[54] MULTIPLE CHAMBER LOUDSPEAKER SYSTEM

[75] Inventor: R. L. Maire, Missoula, Mont.

[73] Assignee: Sounds Resources, Inc., Missoula, Mont.

[21] Appl. No.: 366,487

[22] Filed: Dec. 29, 1994

[51] Int. Cl.[6] .......... H05K 5/00
[52] U.S. Cl. .......... 181/156; 181/199
[58] Field of Search .......... 181/144, 145, 181/156, 199; 381/90, 159

[56] References Cited

U.S. PATENT DOCUMENTS

| | | | |
|---|---|---|---|
| 1,969,704 | 8/1934 | D'Alton . | |
| 3,449,519 | 6/1969 | Mowry . | |
| 3,588,355 | 6/1971 | Holm . | |
| 4,142,603 | 3/1979 | Johnson . | |
| 4,410,064 | 10/1983 | Taddeo . | |
| 4,549,631 | 10/1985 | Bose . | |
| 4,628,528 | 12/1986 | Bose . | |
| 4,875,546 | 10/1989 | Krnan . | |
| 5,025,885 | 6/1991 | Froeschle . | |
| 5,092,424 | 3/1992 | Schreiber et al. | 181/145 |
| 5,115,473 | 5/1992 | Yamagishi . | |
| 5,197,103 | 3/1993 | Hayakawa . | |

*Primary Examiner*—Khanh Dang
*Attorney, Agent, or Firm*—Harry M. Cross, Jr.

[57] ABSTRACT

A speaker enclosure has three chambers sub-divided from one other, each chamber being ported by its own separate acoustic port to the ambient. An electro-acoustic transducer is mounted in communication with two of the chambers, and the third chamber being is isolated from the transducer except for an acoustic port communicating between the third chamber and one of the other two chambers.

10 Claims, 5 Drawing Sheets

MULTIPLE CHAMBER LOUDSPEAKER SYSTEM

BACKGROUND OF THE INVENTION

1. Field of the Invention

This invention relates to loudspeakers, and more particularly to loudspeakers designed to bass reflex speaker enclosures.

2. Brief Description of the Prior Art

Bass reflex or ported speaker enclosure and the tuning of such enclosures and ports have been illustrated in a variety of U.S. patents, of U.S. Pat. Nos. 4,549,631 and 5,025,885 issued to Bose Corporation and U.S. Pat. No. 4,875,546 issued to Teledyne Industries, Inc. are illustrative. These patents in particular describe dual bandpass enclosures where two chambers, each in direct communication with a speaker, are tuned by multiple ports to smooth out the low sound, or low bass, response of the speaker system. In certain situations, particularly concerning sub-woofer loudspeakers for generating the lowest frequency band pass component of the broad-band input signal, where high-decibel output is demanded, existing speaker systems do not completely satisfactorily smooth out the speaker response.

SUMMARY OF THE INVENTION

It is a primary object of this invention to provide a multiple bandpass speaker system having a smoother response, particularly in the sub-woofer region, than heretofore. It is another object to provide such a speaker system wherein greater port tuning possibilities are provided. Another object of this invention is to provide such a speaker systems wherein a tunable slave chamber is provided, in addition to a tunable double chamber dual bandpass arrangement.

In accordance with these objects, the present invention provides a speaker enclosure having three chambers subdivided from one other, each chamber being ported by its own separate acoustic port to the ambient, with an electro-acoustic transducer mounted in communication with two of the chambers, and with the third chamber being isolated from the transducer except for an acoustic port communicating between the third chamber and one of the other two chambers.

The invention comprises a loudspeaker system comprising an enclosure means providing an interior having three acoustic chambers comprising speaker housing and a first partition means and a second partition means, the first and second partition means subdividing the housing into a first acoustic chamber, a second acoustic chamber and a third acoustic chamber; an electro-acoustical transducing means for converting an input electrical signal into a corresponding acoustic output signal, the transducing means being mounted by the first partition means so that the first and second chambers are in direct acoustic communication with the transducing means; port tube means providing a first port acoustically communicating the first chamber to the ambient, a second port acoustically communicating the second chamber to the ambient, a third port acoustically communicating the third chamber to the ambient, and a fourth port acoustically communicating either the first chamber or the second chamber to the third chamber, so that the third chamber is acoustically separated from direct acoustic communication with transducer means and only indirectly communicated with the transducer means by way of the fourth port, and so that the third chamber in only communicated with one of the first and second chambers.

DESCRIPTION OF THE PREFERRED EMBODIMENT

The speaker system of this invention is specifically designed for use as a sub-woofer system. However, the design principles are applicable to any frequency range and, hence, the invention is not limited to sub-woofer systems. The electro-acoustic transducer employed in the speaker system of this invention comprises an energizing element and a vibrating diaphragm for converting an electrical input signal into an acoustic vibration output signal. As is well known, the energizing element may comprise a coil or other conductor of electricity in a magnetic or electric field or a piezo-electric device. The diaphragm has a rear surface and a front surface that, when the transducer is energized, vibrate at a frequency which carries with the input signal to the energizing element. The particular transducer illustrated is a cone-type speaker, and reference herein is particularly made to sub-woofer speakers. However, these references to the preferred type of transducer are not limiting as to the applicability of the principles of this invention.

Figure 3:
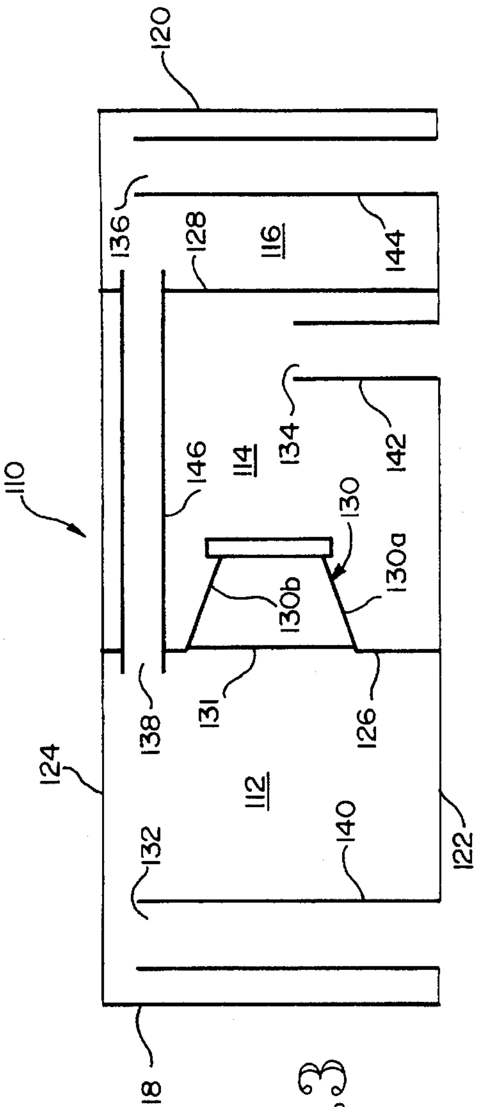
FIG. 3 is a line drawing illustrating the principles of the present invention.
Figure 4A:
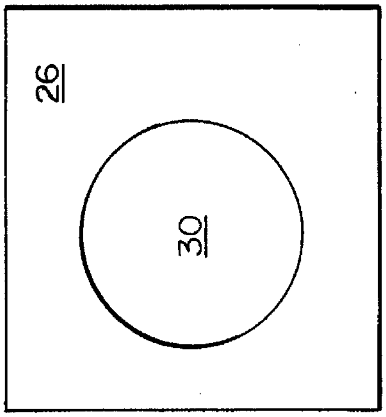
FIGS. 4–4A, 5–5A, and 6–6A illustrate a preferred assembly of three sub-woofer speaker systems using rectangular members to construct the speaker enclosure.
Figure 4:
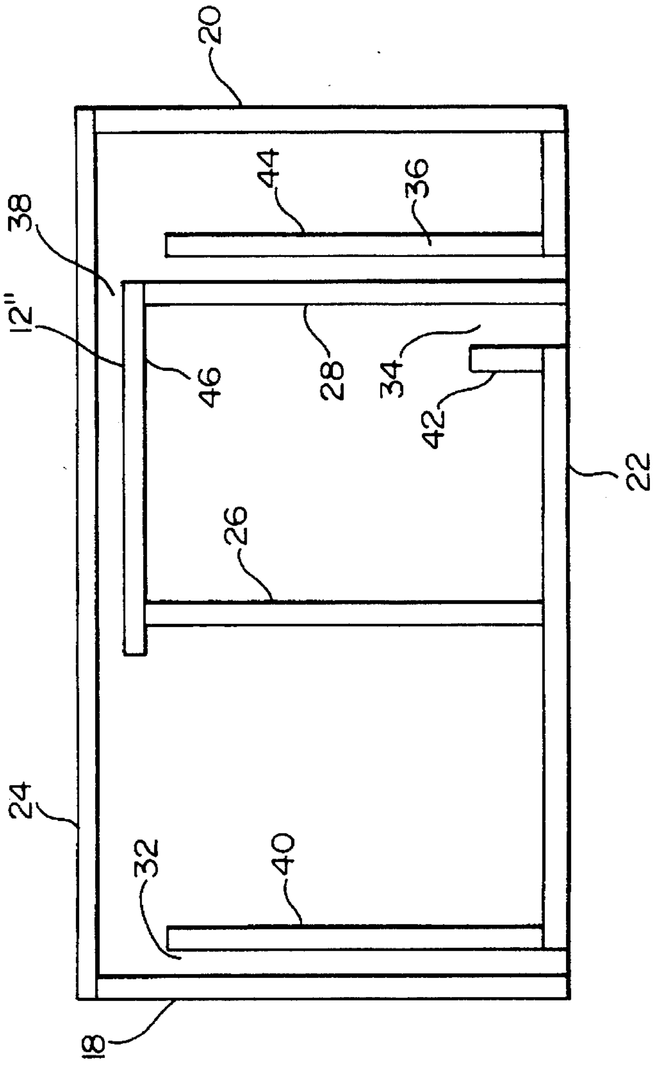
Figure 5A:
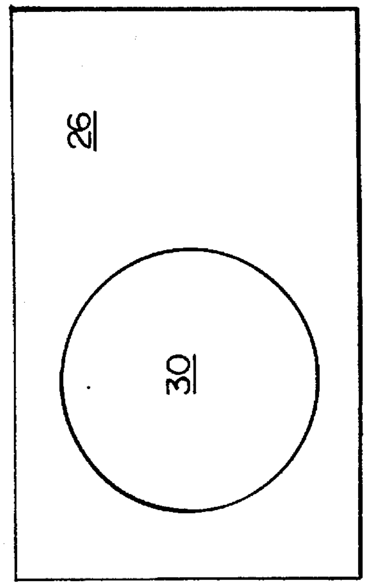
Figure 5:
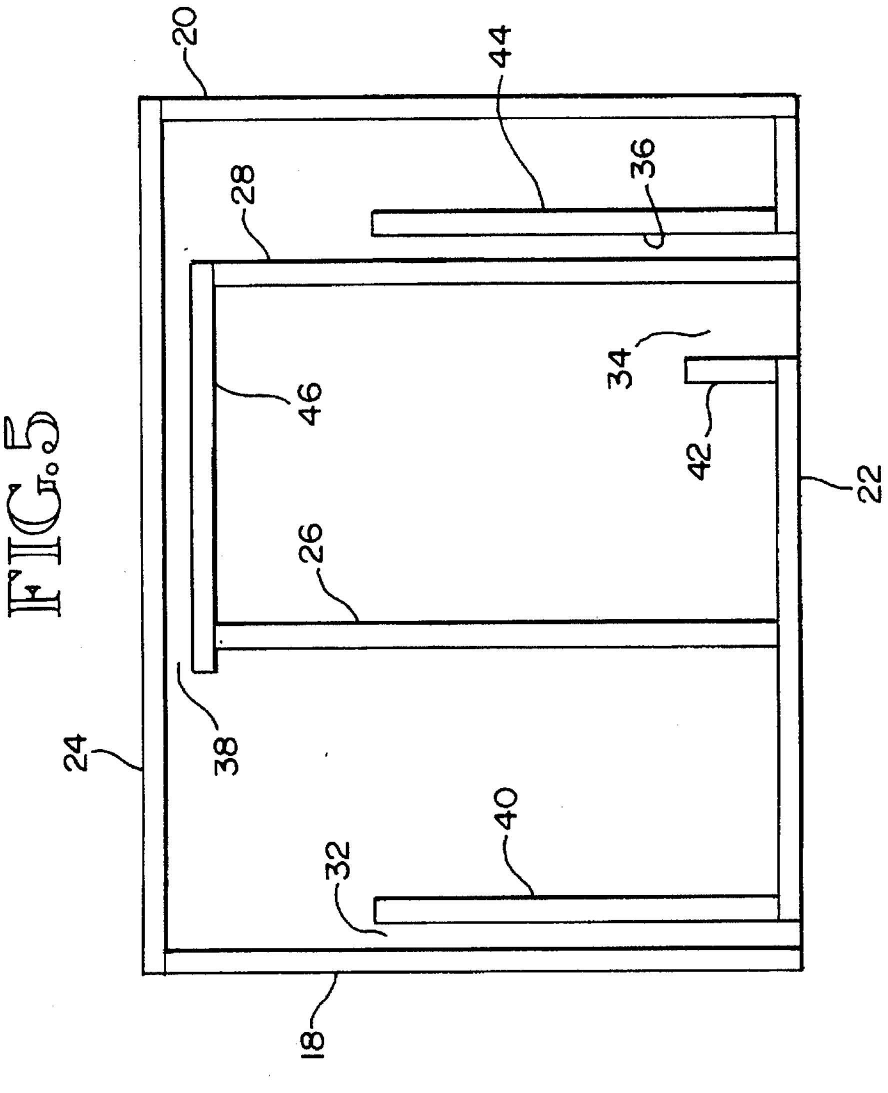
Figure 6A:
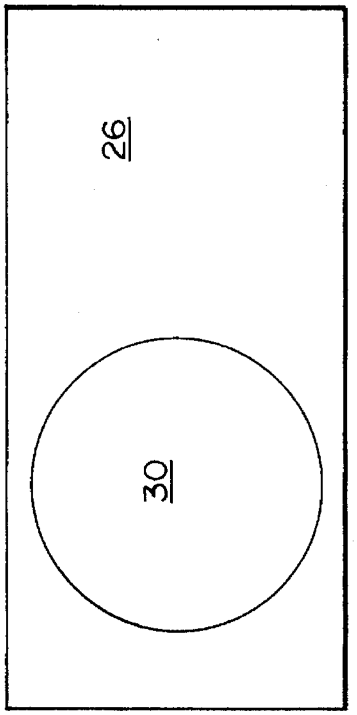
Figure 6:
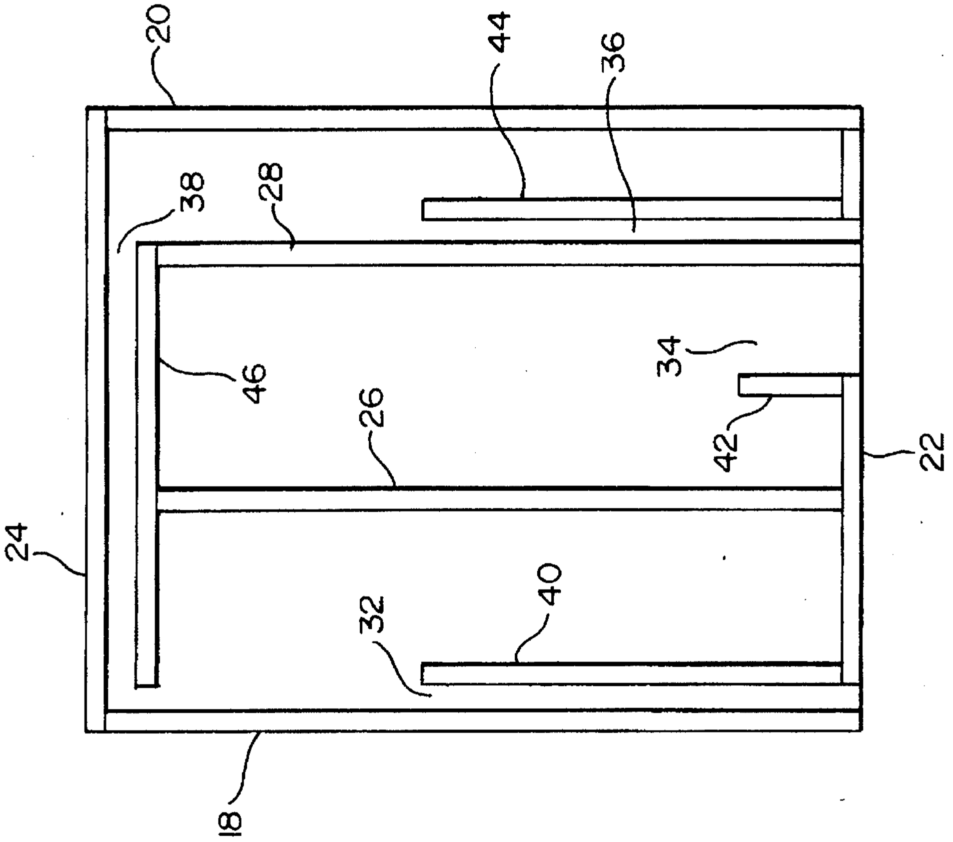

Referring particularly to FIG. 3, the invention comprises a three-chambered enclosure 110, each of the chambers of which, 112, 114 and 116, are acoustically reflective and isolated from the external ambient except for acoustic porting that will be described hereinafter. The acoustic porting described hereinafter is by means of port tubes or vents; however it is known that other means of providing an acoustic mass that serves as a passive radiating means. An example would be what is known in the art as a "drone cone."

First and second chambers 112, 114 are separated by a wall or partition 126. A speaker 130 is mounted therein so that its front surface **130*b* directly communicates with first chamber 112 through an aperture 131 and so that its rear surface 130*a* directly communicates with the second chamber 114. Speaker 130 could be reversed without consequence to the principles of the invention, with front surface 130*a* communicating with the first chamber 112 and the rear surface 130*b* communicating with the second chamber 114. First chamber 112 is acoustically ported to the ambient by port 132 and second chamber 114 is acoustically ported to the ambient by port 134**.

Third chamber 116 is disposed adjacent to second chamber 114 and is separated therefrom by a common wall or partition 128. As illustrated, the third chamber flanks one end of the second chamber and the first chamber flanks the opposite end of the second chamber; the second chamber being located between the first and third chambers. Third chamber 116 is acoustically ported to the ambient by port 136. Third chamber 116 is also acoustically ported to the first chamber 112 by port 138. It is within the principles of the invention for the third chamber 116 to be acoustically ported to the second chamber 114 by port 138. In this latter regard, for a reason that will become apparent from the following paragraph, if the third chamber is ported to the second chamber, it would be appropriate to physically locate the third chamber on the far side of the first chamber; resulting in the first chamber being located between the third and second chambers.

The third chamber 116 is a "slave" to the particular chamber to which it is ported by port 138 inasmuch as port 138 is the only source for the third chamber's acoustic energy. In order for the third chamber to be appropriately tuned, it is highly desirable that the acoustic mass of port 138 and the acoustic mass of port 136 by essentially the same. In the case of the preferred embodiment, where the system is a sub-woofer system, the third chamber would be tuned to a lower frequency than chamber 112. In the preferred case, therefore, port tube 146, defining port 138, would be relatively longer and have a greater cross-sectional area than the port tube 142 that defines port 134. Likewise, port tube 144 relative to port 136 would be essentially a duplicate of port tube 146 and port 138. The resulting length of port tube 146 suggests the convenient placement of the three chambers as illustrated in the Figures. If, on the other hand, port tube 146 were to communicate the third chamber 116 with the second chamber 114 under similar design parameters, of a sub-woofer system with the third chamber tuned to a lower frequency, the length of port tube 146 would be the same as illustrated; and that length would suggest that the third chamber 116 be located on the far side of the first chamber 112 so that port tube 138 could be extended across the width of the intervening first chamber 112. In either of the above-two cases, incorporating the port tube 146 within the confines of the speaker enclosure composed of front wall 122, rear wall 124, end walls 118, 120, and appropriate top and bottom walls is aesthetically desirable; but not operationally necessary.

In a preferred form of the system of this invention as illustrated in the Figures, a sub-woofer speaker system, the first and second chambers would enclose approximately equal volumes of air masses, and the third chamber would enclose an air mass volume approximately one-half the air mass volumes of the first and second chambers. The port tubes 140, 144 and 146 would provide ports 132, 136 and 138 with approximately equal dimensions and air masses. This would result in the third chamber 116 being tuned about an octave below the tuning of the first chamber. The relative tuned frequencies of the first and second chambers 112, 114 would then be determined by the length and cross-sectional area of the port tube 142 for port 134. If the length of port tube 142 is shorter and the area larger than that of port tubes 132 and 120, the tuned frequency of the second chamber will be higher than the tuned frequency of the first and third chambers.

Figure 1:
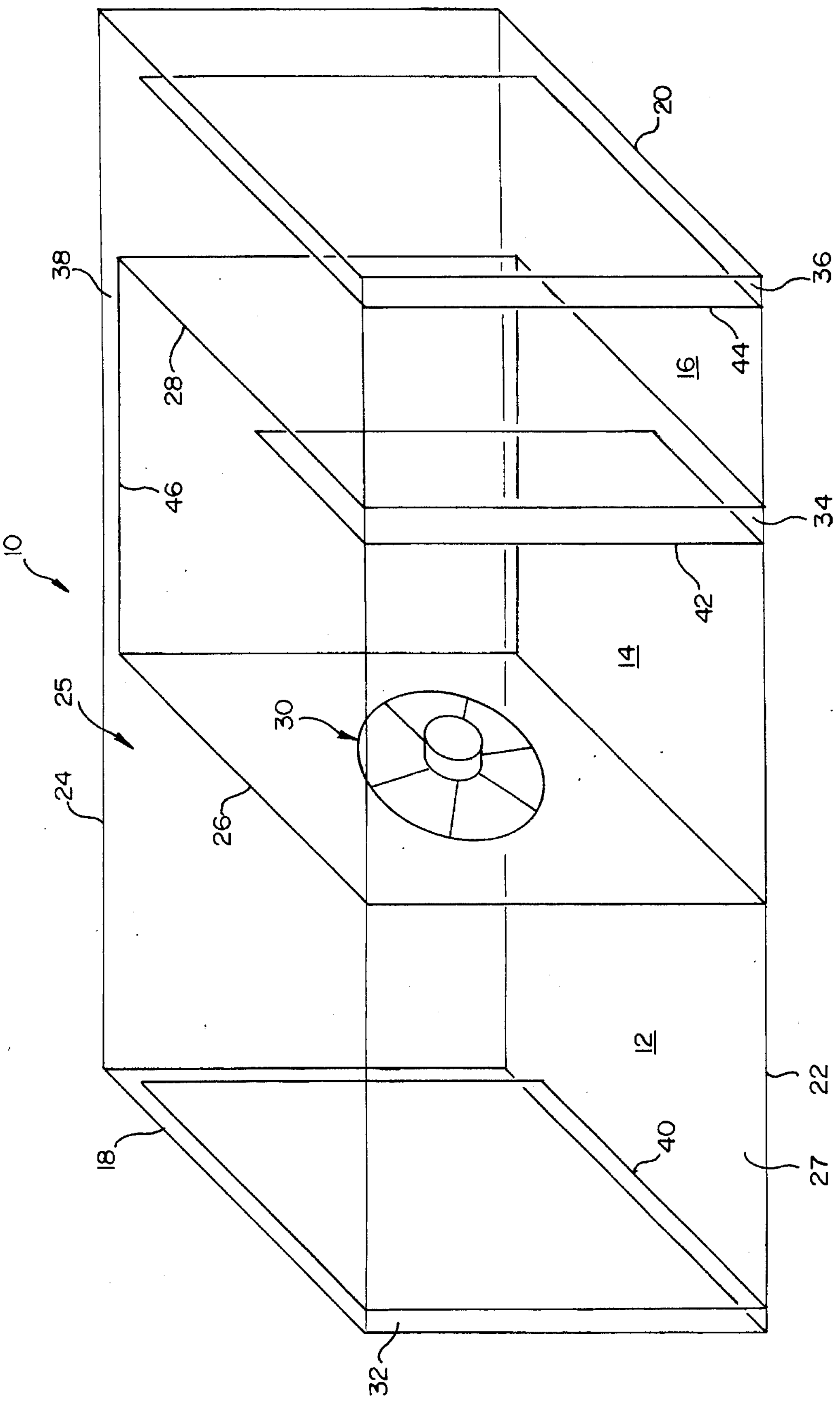
FIG. 1 is a line drawing illustrating in orthographic form a preferred speaker system.
Figure 2:
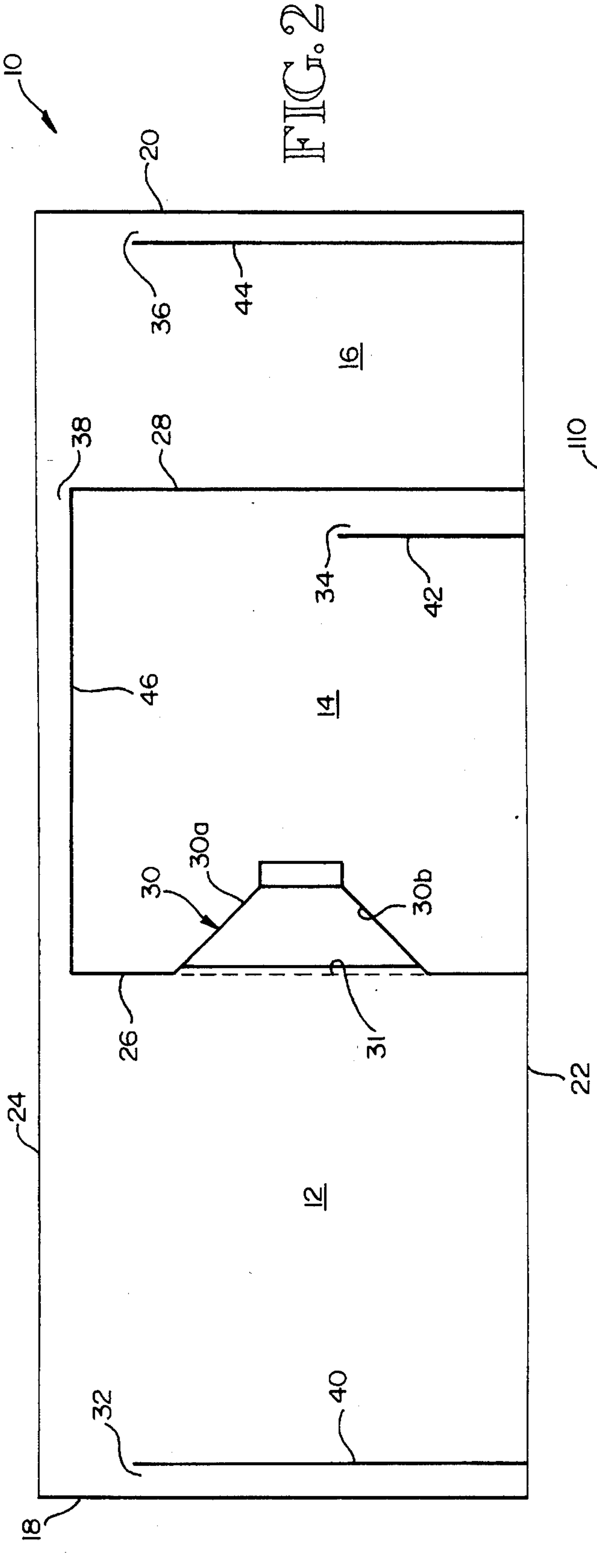
FIG. 2 is a line drawing in top plan view of the FIG. 1 speaker system.

FIGS. 1 and 2 illustrate a preferred arrangement for a sub-woofer speaker system. In these Figures, an enclosure 10 comprises rectangular front and rear walls 22, 24, rectangular end walls 18, 20, and rectangular top and bottom walls 25, 27. In order to emphasize the internal structure of the enclosure 10, the top and bottom front and rear edges are light-lined. A sub-woofer 30 is mounted in a rectangular interior wall or partition 26 around an aperture 31. A second rectangular interior wall or partition 42 is provided. Partitions 26 and 42 subdivide the enclosure into a first chamber 12, a second chamber 14 and a third chamber 16. Speaker 30 is mounted on wall 26 so that the rear surface **30*a* of its cone is directly exposed to chamber 14 and so that the front surface 30*b* of its cone is directly exposed to chamber 12. A rectangular port wall 40 is located near end wall 18 and parallel thereto to define a narrow port 32 that has a narrow width and a height equal to the interior height of the enclosure. A rectangular port wall 44 is located near end wall 20 and parallel thereto to define a narrow port 36 that has a narrow width and a height equal to the interior height of the enclosure. A rectangular port wall 42 is located near wall 28 and parallel thereto to define a narrow port 34 that has a narrow width and a height equal to the interior height of the enclosure. Port walls 40 and 44 have the same dimensions and are spaced from their adjacent walls, 18/20, so that ports 32 and 36 have the equal lengths and the same cross-sectional areas. Port wall 42 is shorter and spaced further from its adjacent wall 28, compared to the spacing and lengths of port walls 40 and 44, so that port 34 is shorter and has a greater cross-section area compared to ports 32 and 36. A third port wall 46 is located at the rear ends of the walls 26 and 28 to define a fourth port 38 that connects chamber 12 to chamber 16. Port wall 46 has the same dimensions as port walls 40 and 44 and is spaced the same distance from its adjacent wall 24 as port walls 40/44 are from their adjacent walls 18/20 so that port 38 has a length and cross-sectional area equal to those of ports 32 and 36. In a preferred embodiment, port wall 42 is a fraction (about ¼th) of the length of port walls 40, 44 and 46 and is spaced twice as far from its adjacent wall 28 as the spacing of port walls 24, 44 and 46** from their adjacent walls.

For a sub-woofer system arranged as shown in FIGS. 1 and 2, the following illustrate some suitable tuning parameters.

For an eight inch sub-woofer with chamber 14 tuned to 39 Hz and chambers 12 and 16 tuned to 72 Hz: enclosure 10 would have a height of about 12 inches, a width of about 28 inches and a depth of about 16 inches; chambers 12 and 14 would have an air mass volume of one cu. ft. and chamber 16 would have an air mass volume of ½ cu. ft.; port walls 40, 44 and 46 would be 12 inches long×12 inches high and spaced 0.75 inches from their adjacent walls so as to define ports 32, 36 and 38 having a length of 12 inches and a cross-section area of 9 sq. in.; and port wall 42 would be 3 inches long×12 inches high and spaced 1.5 inches from its adjacent wall so as to define port 34 having a length of 3 inches long and a cross-sectional area of 18 sq. in.

For a ten inch sub-woofer with chamber 14 tuned to 32 Hz and chambers 12 and 16 tuned to 80 Hz: enclosure 10 would have a height of about 12 inches, a width of about 30 inches and a depth of about 23 inches; chambers 12 and 14 would have an air mass volume of one and one-half cu. ft. and chamber 16 would have an air mass volume of ¾ cu. ft.; port walls 40, 44 and 46 would be 14 inches long×12 inches high and spaced 1 inch from their adjacent walls so as to define ports 32, 36 and 38 having a length of 14 inches and a cross-section area of 14 sq. in.; and port wall 42 would be 4 inches long×12 inches high and spaced 2.5 inches from its adjacent wall so as to define port 34 having a length of 3 inches long and a cross-sectional area of 30 sq. in.

FIGS. 4–4A, 5–5A and 6–6A illustrate the structural configurations for preferred embodiments of the enclosure for sub-woofer systems having, respectively, an 8 inch, 10 inch and 12 inch sub-woofer.

While the preferred embodiment of the invention has been described herein, variations in the design may be made. The scope of the invention, therefore, is only to be limited by the claims appended hereto.

The embodiments of the invention in which an exclusive property is claimed are defined as follows:

In the claims:

1. A loudspeaker system comprising:

a) an enclosure means providing an interior having three acoustic chambers comprising a speaker housing and a first partition means and a second partition means, said first and second partition means subdividing said housing into a first acoustic chamber, a second acoustic chamber and a third acoustic chamber;

b) an electro-acoustical transducing means for converting an input electrical signal into a corresponding acoustic output signal, said transducing means being mounted by said first partition means so that said first and second chambers are in direct acoustic communication with said transducing means; and c) port tube means providing a first port acoustically communicating said first chamber to the ambient, a second port acoustically communicating said second chamber to the ambient, a third port acoustically communicating said third chamber to the ambient, and a fourth port acoustically communicating either said first chamber or said second chamber to said third chamber, so that said third chamber is acoustically separated from direct acoustic communication with said transducing means and only indirectly communicated with said transducing means by way of said fourth port, and so that said third chamber is only communicated with one of said first and second chambers.

2. The loudspeaker system of claim 1 wherein said enclosure means comprises rectangular front, rear, end, top and bottom walls; wherein said first and second partition means comprises rectangular walls; and wherein said port tube means comprise first, second, third and fourth port walls, said port walls being so constructed and arranged with respect to the enclosure walls of said enclosure means whereby said first, second, third and fourth ports are provided between said port walls and adjacent ones of said enclosure walls so as to provide said ports with rectangular cross-sections.

3. The loudspeaker system of claim 1 wherein said first and second chambers contain about equal air mass volumes and third chamber contains about one-half the air mass volume of the other chambers; and wherein said first, third and fourth ports have about equal air mass volumes, and said second port has an air mass volume that is a fraction of the air mass volume of the other ports.

4. The loudspeaker system of claim 2 wherein said first and second chambers contain about equal air mass volumes and third chamber contains about one-half the air mass volume of the other chambers; and wherein said first, third and fourth ports have about equal air mass volumes, and said second port has an air mass volume that is a fraction of the air mass volume of the other ports.

5. The loudspeaker system of claim 1 wherein said first, second and third chambers are arranged in side-by-side relationship with said second chamber being positioned between said first and third chambers; and wherein said fourth port is arranged to communicate between said first and third chambers.

6. The loudspeaker system of claim 5 wherein said transducing means comprises an energizing element and a vibrating diaphragm, said vibrating diaphragm having a front surface and a rear surface; and wherein said transducing means is oriented with respect to said first partition means so that its front surface is directly exposed to said first chamber and so that its rear surface is directly exposed to said second chamber.

7. The loudspeaker system of claim 5 wherein said transducing means comprises an energizing element and a vibrating diaphragm, said vibrating diaphragm having a front surface and a rear surface; and wherein said transducer means is oriented with respect to said first partition means so that its rear surface is directly exposed to said first chamber and so that its front surface is directly exposed to said second chamber.

8. The loudspeaker system of claim 1 wherein said first chamber and third chambers and said first, third and fourth ports are so constructed and arranged that said first and third chambers are acoustically tuned to a lower frequency; and wherein said second chamber and said second port are acoustically tuned to a higher frequency.

9. The loudspeaker system of claim 8 wherein said first, third and fourth ports have about equal lengths and cross-sectional areas.

10. The loudspeaker system of claim 9 wherein said second port has a shorter length than any of said other ports and a greater cross-sectional area than any of said other ports.

* * * * *